United States Patent [19]
Kawasumi

[11] Patent Number: 6,127,862
[45] Date of Patent: Oct. 3, 2000

[54] PROGRAMMABLE IMPEDANCE CIRCUIT

[75] Inventor: Atsushi Kawasumi, Yokohama, Japan

[73] Assignee: Kabushiki Kaisha Toshiba, Kawasaki, Japan

[21] Appl. No.: 09/144,634

[22] Filed: Aug. 31, 1998

[30] Foreign Application Priority Data

Sep. 1, 1997 [JP] Japan .................................. 9-235949

[51] Int. Cl.$^7$ ...................... H03K 19/094; H03K 17/687
[52] U.S. Cl. ............................ 327/112; 327/388; 326/27; 326/87
[58] Field of Search ................................ 326/27, 30, 85, 326/87, 91, 82; 327/108, 112, 374, 379, 388, 389, 391

[56] References Cited

U.S. PATENT DOCUMENTS

| | | | |
|---|---|---|---|
| 4,408,135 | 10/1983 | Yuyama et al. ............................. | 326/87 |
| 4,719,369 | 1/1988 | Asano et al. ............................... | 326/30 |
| 5,248,907 | 9/1993 | Lin et al. ................................... | 326/27 |

*Primary Examiner*—Tuan T. Lam
*Attorney, Agent, or Firm*—Banner & Witcoff, Ltd.

[57] ABSTRACT

The programmable impedance circuit of the present invention includes a dummy resistance element dummy buffer means including a plurality of buffer portions, each buffer portion having a serial circuit made of a transistor and a resistance element, a binary selection signal generating circuit, connected to the dummy resistance element and the dummy buffer means, for controlling a current flowing in the dummy resistance element and a current flowing in a predetermined buffer portion of the dummy buffer to be equalized to each other, and outputting binary selection signals of a logic level corresponding to that it is regarded that matching of impedances before being input to an output buffer is achieved when both the currents are equalized to each other, and output buffer means for suppressing a variance of the impedance value even when an output voltage is in a transiently changing state, in accordance with the logic level of the binary selection signal as receiving binary selection signals from the binary selection signal generating circuit, and with complimentary logic levels as receiving complimentary input data.

9 Claims, 8 Drawing Sheets

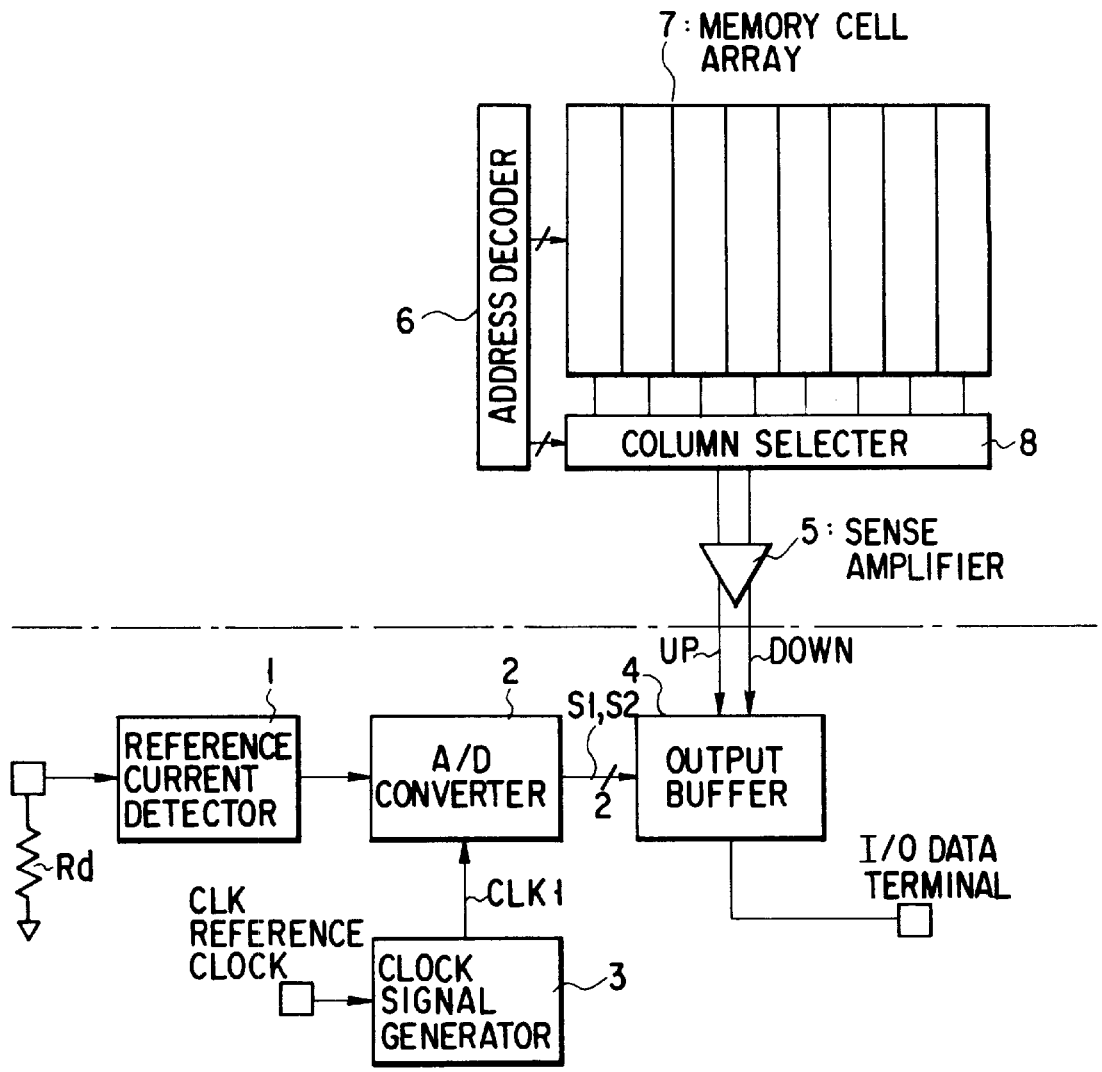
F I G. 6

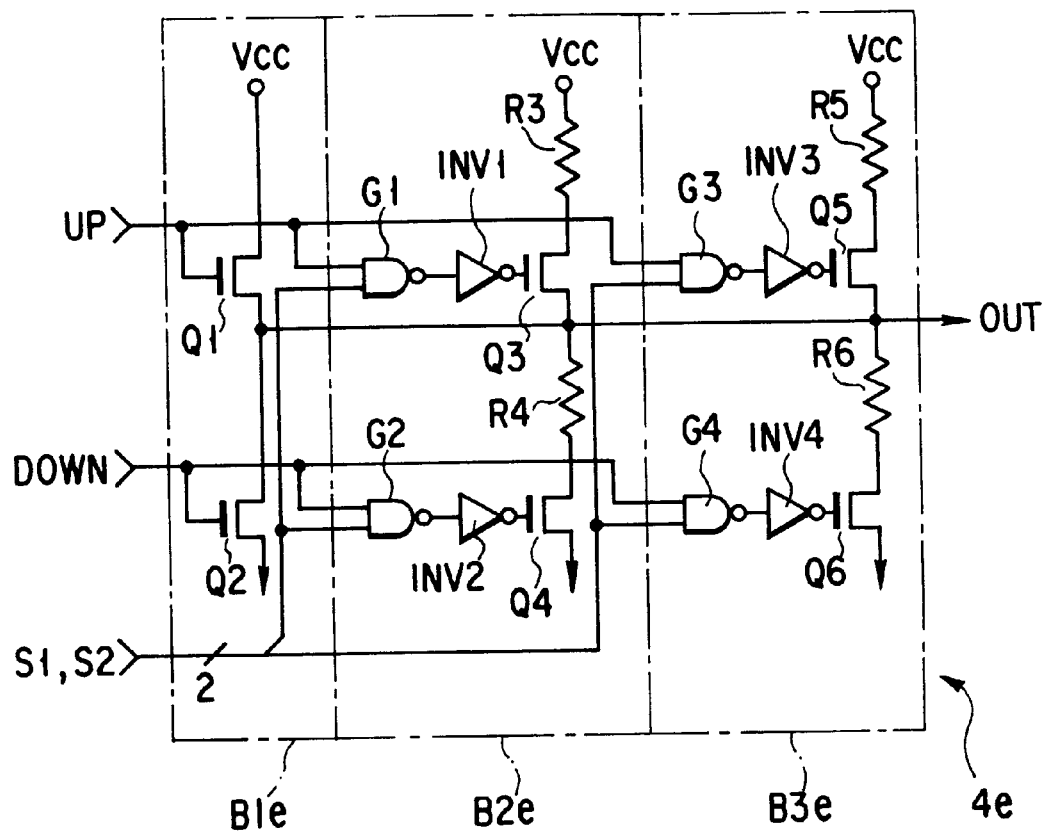
F I G. 15

PROGRAMMABLE IMPEDANCE CIRCUIT

BACKGROUND OF THE INVENTION

The present invention relates to a programmable impedance circuit which carries out a impedance matching between a signal transmission line and an output buffer for the transmission of signals between semiconductor integrated circuits, and more specifically to a programmable impedance circuit capable of reducing the variance in the impedance value particularly in the case where the output voltage of the output buffer is in a transient state.

As the speed of the operation of semiconductor integral circuits is drastically increased recently, it becomes necessary to increase the speed of signal transmission carried out between semiconductor integrated circuits. One of the important factors for achieving a high speed signal transmission, is to carry out an impedance matching for matching impedance values of transmission lines and output buffers.

When the impedance value of a transmission line is set to Z0 and the impedance value of an output buffer is set to Zs, a reflection having a reflectance of $\rho=(Zs-Z0)/(Zs+Z0)$ occurs at a terminal of the transmission line if no termination is carried out.

In order to shorten the rise time or fall time of a transmission line, it is necessary to decrease the impedance value Zs of the output buffer. However, as is clear from the equation of the reflectance, when the Zs value is decreased extremely, data of opposite phase is reflected, and a ringing, in which the potential of a transmission line is vibrated, occurs.

FIG. 1 shows a normal waveform having no ringing, whereas FIG. 2 shows a waveform which contains a ringing. If a strong ringing occurs, it is no longer possible to carry out a normal data transmission. In order to transmit a signal at the maximum speed without causing a ringing, it is necessary to make the impedance value of the transmission line and the impedance value of the output buffer match with each other.

However, the impedance value of the transmission line varies depending upon the material of the printed board on which semiconductor integrated circuits are mounted. Therefore, it is difficult to make the impedance value of the output buffer of a semiconductor integrated circuit, and the impedance value of the transmission line to match with each other at all times.

Further, even if these impedance values are matched, the impedance value of the output buffer of the semiconductor integrated circuit is changed depending upon the conditions for operating a semiconductor integrated circuit (such as the temperature of the atmosphere and power voltage), in the case where the output buffer is made of MOS transistors only. As a result, an impedance matching cannot be achieved.

In order to solve the above-described drawback, a programmable impedance circuit capable of varying the impedance value of the output buffer programmably has been proposed. In the programmable impedance circuit of this type, the impedance value of a dummy resistance provided outside is monitored periodically, and the type and number of MOS transistors to be turned on, of those constituting the output buffer, are changed, so that the impedance value of the output buffer is set to an impedance value R (for example, $R=r\times\frac{1}{5}$) which is proportional to the impedance value r of the dummy resistance. With this structure, it becomes possible to variably control the impedance value of the output buffer by setting the resistance value of the external dummy resistance.

FIG. 3 is a diagram showing an example of an output buffer of a conventional programmable impedance circuit.

The output buffer includes MOS transistors Q1 to Q6, NAND gates G1 to G4 and inverters INV1 to INV4, and complimentary input data up and down signals and binary section signals S1 and S2 are input from outside to the output buffer.

With the impedance value of the output buffer, selected by the binary selection signals S1 and S2, data having the same logic level as that of one of input data up signal of the complimentary input data is output. The input data up signal can be regarded as data for the "out" of the output buffer to output a logic level "1".

The circuit shown in FIG. 3 is divided into three buffer sections B1, B2 and B3. Of these sections, 2-bit binary section signals S1 and S2 are input respectively to the two buffer sections B2 and B3. The buffer section B1 is activated (turned on) at all times.

As the logic level of the binary section signals S1 and S2 is switched, any of the four types of the output impedance values for the output buffer is selected.

Further, by means of the buffer section B1 to which the binary selection signals S1 and S2 are not input, the maximum output impedance value is set.

The output buffer 4 in the conventional programmable impedance circuit shown in FIG. 3 is able to variably control the output impedance value by the logic level of the binary selection signals S1 and S2; however the programmable impedance circuit entails the following drawbacks which are caused by the characteristics of the output buffer.

That is, the output impedance value of the output buffer is adjusted to a value corresponding to the resistance value of the dummy resistance provided outside under a bias condition, and therefore it is not always possible to obtain a predetermined impedance value when the output voltage is in a transient state. For example, in the case where a circuit of the output buffer shown in FIG. 3 is formed of NMOS transistors, the characteristics of output-voltage to output-current will be as can be seen in FIG. 4 when the output voltage varies from a high level to a low level. The solid line in the figure represents an actually measured curve of output-voltage to output-current characteristics, and the dotted line represents an ideal straight line to be obtained in the case where the impedance value is assumed not to change.

As is clear from this figure, as the output voltage becomes higher, the deviation from the ideal straight line becomes more prominent, and thus the impedance value varies.

Further, FIG. 5 illustrates the relationship between an output voltage and an output current in the case where the signal voltage varies from a low level to a high level. This figure indicates that as the voltage level for specifying the selected impedance of the output buffer to match the impedance value of the transmission line and the impedance value of the output buffer, deviates from the dotted line which represents the ideal straight line to be obtained in the case where the impedance is assumed not to change, the impedance value of the output buffer varies more.

As described above, it is known that a ringing may occur in a transient state where the output voltage is varying, due to reflection.

It should be noted that the conventionally known programmable impedance circuit is discussed in Horald Piro et al., "A 300 MHz, 3.3V 1 Mb SRAM Fabricated in a 0.5 µm CMOS Process" ISSCC Digest of Technical Papers, pp 148–149, 1996.

BRIEF SUMMARY OF THE INVENTION

The object of the present invention is to provide a programmable impedance circuit which can solve the above-described drawbacks, and whose impedance value does not vary even in a transient state of the output level of the output buffer.

In order to achieve the above-described object, there is provided according to the present invention a programmable impedance circuit comprising:

a dummy resistance element;

dummy buffer means including a plurality of buffer portions, each buffer portion having a serial circuit made of a transistor and a resistance element;

a binary selection signal generating circuit, connected to the dummy resistance element and the dummy buffer means, for controlling a current flowing in the dummy resistance element and a current flowing in a predetermined buffer portion of the dummy buffer to be equalized to each other, and outputting binary selection signals of a logic level corresponding to that it is regarded that matching of impedances before being input to an output buffer is achieved when both the currents are equalized to each other; and output buffer means for suppressing a variance of the impedance value even when an output voltage is in a transiently changing state, in accordance with the logic level of the binary selection signal as receiving binary selection signals from the binary selection signal generating circuit, and with complimentary logic levels as receiving complimentary input data.

Further, according to the present invention there is provided an output buffer circuit capable of reducing a variance of an impedance value even in a transient state in which an output voltage is changing, the output buffer circuit comprising:

a plurality of buffer portions having different impedances, the plurality of buffer portions including:

a first buffer portion having a first serial circuit made of a resistance element and a switching element to which one of complimentary input data is input, and a second serial circuit connected to the first serial circuit and made of a resistance element and a switching element to which the other of complimentary input data is input;

a second buffer portion having a first NAND gate for receiving one of the complimentary input data and one of binary selection signals, an inverter for inverting an output of the first NAND gate, a switching element for which the output of the inverter is a gate input, and a resistance element connected to the switching element, the switching element and the resistance element forming a third serial circuit, and having a second NAND gate for receiving an other of the complimentary input data and one of binary selection signals, an inverter for inverting an output of the second NAND gate, and a switching element for which the output of the inverter is a gate input, a resistance element connected to the switching element and the switching element and the resistance element forming the fourth serial circuit;

a third buffer portion having a third NAND gate for receiving one of the complimentary input data and an other of binary selection signals, an inverter for inverting an output of the third NAND gate, and a switching element for which the output of the inverter is a gate input, a resistance element connected to the switching element and the switching element and the resistance element forming the fifth serial circuit, and having, a fourth NAND gate for receiving an other of the complimentary input data and an other of binary selection signals, an inverter for inverting an output of the fourth NAND gate, and a switching element for which the output of the inverter is a gate input, a resistance element connected to the switching element and the switching element and the resistance element forming the sixth serial circuit; and an output terminal for rendering a connection node of the first and second serial circuits, a connection node of the third and fourth serial circuits and a connection node of the fifth and sixth circuits in common.

According to the present invention, there is furthermore provided an output buffer circuit capable of reducing a variance of an impedance value even in a transient state in which an output voltage is changing, the output buffer circuit comprising:

a plurality of buffer portions having different impedances, the plurality of buffer portions including:

a first buffer portion having a first serial circuit having a first PMOS transistor, to a gate of which one of complimentary input data is input, a second PMOS transistor, to a gate of which one of binary selection input data is input via an inverter, a resistance element connected to the second PMOS transistor, which are connected in series; and a second serial circuit connected serially to the first serial circuit, and having a resistance element, a first NMOS transistor, to a gate of which one of the binary selection signals is input, and a second NMOS transistor, to a gate of which one of the complimentary input data is input, which are connected in series;

a second buffer portion having a third serial circuit having a third PMOS transistor, to a gate of which one of the complimentary input data is input, a fourth PMOS transistor, to a gate of which an other of the binary selection signals is input via an inverter, and a resistance element connected to the fourth PMOS transistor, which are connected in series;

a fourth serial circuit connected serially to the third serial circuit, and having a resistance element, a third NMOS transistor, to a gate of which an other of the binary selection signals is input, and a fourth NMOS transistor, to a gate of which one of the complimentary input data is input, which are connected in series; and an output terminal for rendering a connection node of the first and second serial circuits, and a connection node of the third and fourth serial circuits in common.

With the above-described structure, the output buffer of the programmable impedance circuit of the present invention has a plurality of buffer portions, and at least one of these buffer portions includes a switching element and a resistance element connected in series. Therefore, the impedance value of the output buffer is set on the basis of the ON resistance value of the switching element and the resistance value of the resistance element. In this manner, the variance of the impedance value of the output buffer is suppressed in a transient state in which the output voltage of the output buffer varies. Consequently, the present invention can achieve a superior variance suppressing effect as compared to the case where the impedance value of the output buffer is set merely on the basis of the ON resistance of the switching element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 6 is a block diagram showing an embodiment of the programmable impedance circuit according to the present invention;

FIG. 15 is a diagram specifically showing a circuit structure of an output buffer of a programmable impedance circuit according to the fifth embodiment of the present invention.

DETAILED DESCRIPTION OF THE INVENTION

Figure 1:
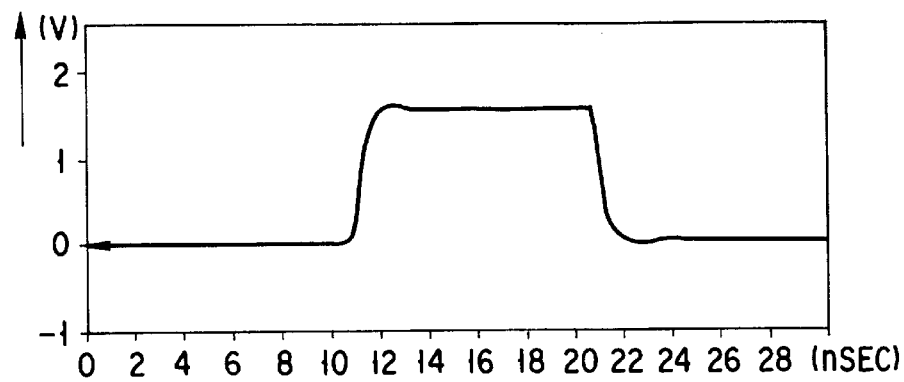
FIG. 1 is a diagram showing a normal waveform of a potential signal for a transmission line between semiconductor integrated circuits.
Figure 2:
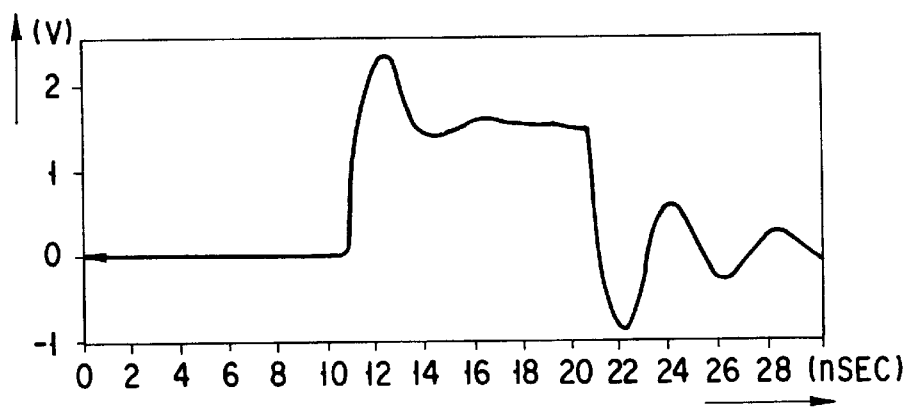
FIG. 2 is a diagram showing a waveform in which a ringing, which is vibration of the potential of the transmission line between semiconductor integrated circuits, is occurring.

Embodiments of the programmable impedance circuit of the present invention will now be described in detail with reference to accompanying drawings.

Each of the programmable impedance circuits of the embodiments is formed on a semiconductor substrate.

FIG. 6 is a block diagram schematically showing an embodiment of the programmable impedance circuit of the present invention.

The resistance of a dummy resistance element Rd is set in advance to a predetermined value (for example, 250 to 500 ohm, in accordance with the characteristics impedance value of the printed board. A reference current detection circuit 1 is connected to a dummy resistance element Rd, and thus a current flowing through the dummy resistance element Rd is detected. The current detected is transferred to an A/D converter 2.

The A/D converter 2, upon reception of a clock signal CLK1 from a clock generating circuit 3, supplies binary signals S1 and S2 to an output buffer 4, so as to switch the impedance value of the output buffer 4. It should be noted that the structure and operation of the A/D converter 2 will be explained later.

The clock generating circuit 3 generates an operation timing signal CLK1 for the A/D converter 2, on the basis of a reference clock CLK input from outside.

To a sense amplifier 5, cell data read from a memory cell array 7 on the basis of the decoding results at an address decoder 6, is input via a column selector 8.

The sense amplifier 5 amplifies cell data inputted thereto, outputs complimentary data up and down signals, and inputs them to the output buffer 4.

At the output buffer 4, the output impedance is made variable in accordance with the up signal and down signal obtained via the sense amplifier 5 and the binary selection signals S1 and S2 from the A/D converter 2, and the output impedance is sent to an I/O data terminal as an output of the output buffer 4. The structure and operation of the output buffer 4 will be described later.

Figure 7:
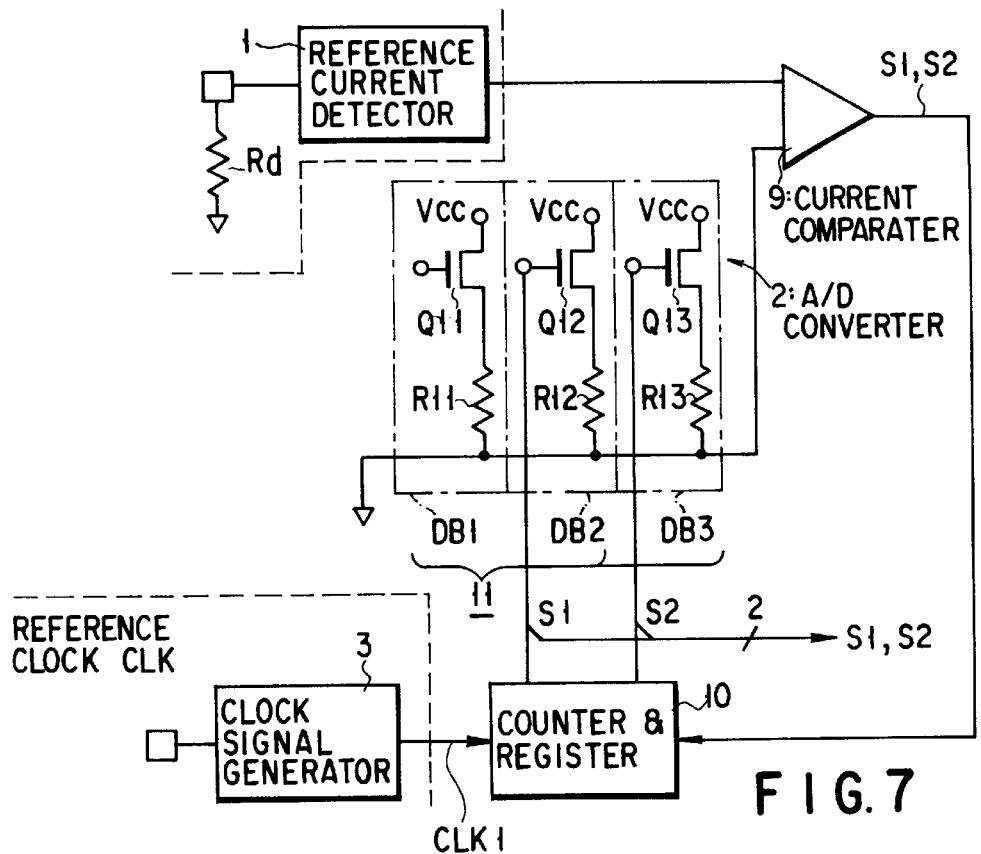
FIG. 7 is a block diagram showing a specific structural example which extracts partially the programmable impedance circuit shown in FIG. 6.

FIG. 7 is a diagram showing the internal structure of the A/D converter 2. The A/D converter 2 contains a dummy buffer 11 consisting of a plurality of buffer portions DB1 to DB3, a current comparator 9 for receiving a total of currents flowing through the buffer portions DB1 to DB3 of the dummy buffer, and a current flowing in a dummy resistance element Rd, that is, an output from a reference current detection circuit 1, so as to compare both outputs with each other and output a difference in current, and a counter-register 10 for receiving an output from the current comparator 9 and supplying binary selection signals S1 and S2 to the buffer portions DB2 and DB3 and the output buffer 4.

The buffer portion DB1 of the dummy buffer 11 includes a transistor Q 11 and a resistance element R11 connected in series. The drain terminal of the transistor Q11 is connected to a power terminal Vcc, the source terminal thereof is connected to an end of the resistance element R11 and another end of the resistance element R11 is grounded. The gate terminal of the transistor Q11 is set at high level at all times, and the transistor Q11 is set in an active state (ON state) at all times.

The buffer portions DB2 and DB3 have a structure similar to that of the buffer portion DB1; however a binary selection signal S1 output from the counter-register 10 is input to the gate terminal of the transistor Q12, and a binary selection signal S2 output from the counter-register 10 is input to the gate terminal of the transistor Q13. Further, the impedance values of the buffer portions DB1 to DB3 are different from each other.

The counter-register 10 outputs the binary selection signals S1 and S2 to the buffer portions DB2 and DB3 of the dummy buffer 11, and the output buffer 4 while switching the logic level, in reply to an output from the current comparator 9. More specifically, the counter-register 10 switches the logic level of the binary selection signals S1 and S2 such that the total of the currents flowing through the buffer portions DB1 to DB3, and the current flowing through the dummy resistance element Rd are controlled to be equal to each other. When these currents become equal to each other, it is regarded that the matching of the impedance of the dummy buffer 11, obtained before it is input to the output buffer, has been completed. Thus, the setting of an output impedance is carried out for the output buffer 4, in accordance with the logic level of each of the binary selection signals S1 and S2 at that time.

Figure 8:
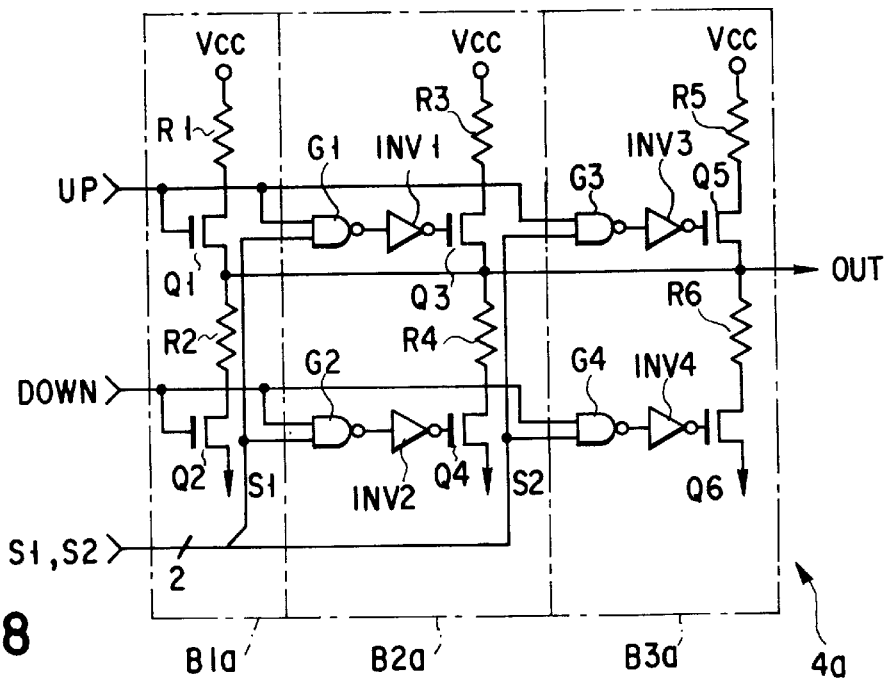
FIG. 8 is a circuit structural diagram showing the first embodiment of the output buffer of the programmable impedance circuit according to the present invention.

FIG. 8 is a circuit structure diagram specifically showing an output buffer of the programmable impedance circuit according to the first embodiment of the present invention.

Figure 3:
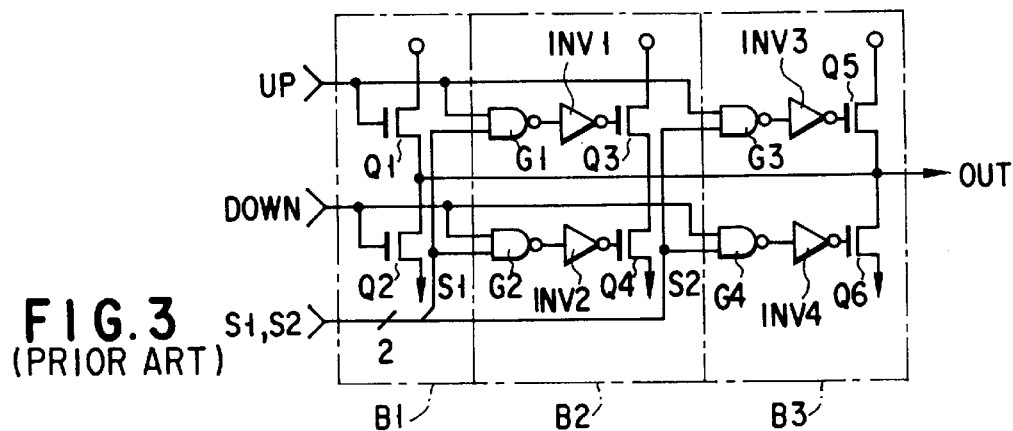
FIG. 3 is a circuit diagram showing an output buffer in a conventional programmable impedance circuit.
Figure 4:
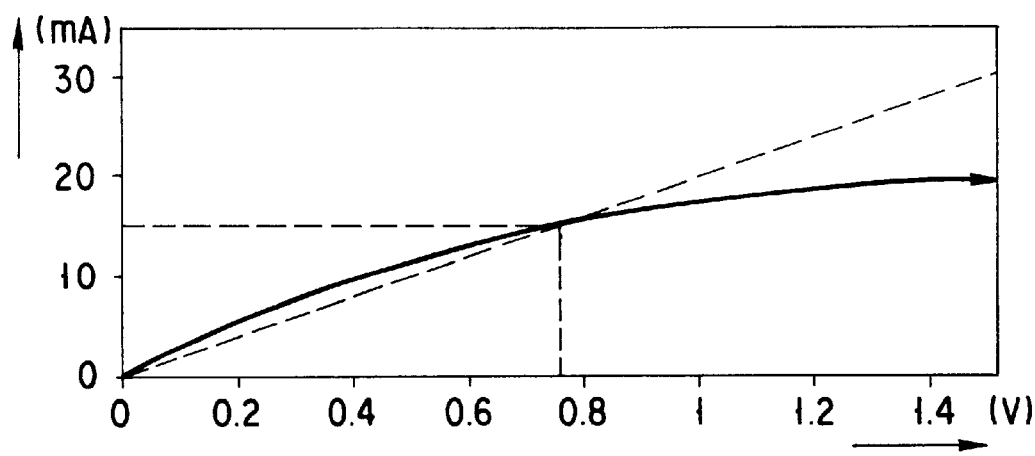
FIG. 4 is a diagram showing the characteristics of output voltage-output current, exhibited along with the variance in the impedance in the case where the output voltage varies from a high level to a low level in the circuit of the output buffer shown in FIG. 3.

In this figure, structural elements common to those of the conventional output buffer shown in FIG. 3 are designated by the same reference numerals, and the explanations for such structures will not be repeated.

An output buffer 4a is similar to the output buffer shown in FIG. 3 in the respect that it also includes three buffer portions B1a, B2a and B3a. However, the output buffer 4a differs from the output buffer of FIG. 3 in the following respects. That is, resistance elements R1 and R2 are respectively connected to drain terminals of MOS transistors Q1 and Q2 in the buffer portion B1a, resistance elements R3 and R4 are respectively connected to drain terminals of MOS transistors Q3 and Q4 in the buffer portion B2a, and resistance elements R5 and R6 are respectively connected to drain terminals of MOS transistors Q5 and Q6 in the buffer portion B3a.

The buffer portion B1a includes NMOS transistors Q1 and Q2 and resistance elements R1 and R2. An end of the resistance element R1 is connected to a power terminal Vcc, another end of the resistance element R1 is connected to a drain terminal of the transistor Q1, a source terminal thereof is connected to an end of the resistance element R2, another end of the resistance element R2 is connected to a drain terminal of the transistor Q2, and a source terminal of the transistor Q2 is grounded. To a gate terminal of the transistor Q1, an "up" signal output from the sense amplifier 5 shown in FIG. 6 is input, whereas to a gate terminal of the transistor Q2, a "down" signal output from the sense amplifier 5 is input.

In the meantime, the buffer portion B2a includes NAND gates G1 and G2, and inverters INV1 and INV2, in addition to NMOS transistors Q3 and Q4 and resistance elements R3 and R4, which are connected in a similar manner to that of the buffer portion B1a. An "up" signal is input to one of input terminals of the NAND gate G1, whereas a binary selection signal S1 is input to another one of the input terminal.

The output of the NAND gate G1 is input to the gate terminal of the NMOS transistor Q3 via the inverter INV1.

Further, a "down" signal is input to one of the input terminals of the NAND gate G2, and the binary section signal S1 is input to the other input terminal.

The output of the NAND gate G2 is input to the gate terminal of the NMOS transistor Q4 via the inverter INV2.

In the meantime, the buffer portion B3a includes NAND gates G3 and G4, and inverters INV3 and INV4, in addition to NMOS transistors Q5 and Q6 and resistance elements R5 and R6, which are connected in a similar manner to that of the buffer portion B1a. An "up" signal is input to one of input terminals of the NAND gate G3, whereas a binary selection signal S2 is input to another one of the input terminal. The output of the NAND gate G3 is input to the gate terminal of the NMOS transistor Q5 via the inverter INV3.

Further, a "down" signal is input to one of the input terminals of the NAND gate G4, and the binary section signal S2 is input to the other input terminal. The output of the NAND gate G4 is input to the gate terminal of the NMOS transistor Q6 via the inverter INV4.

Figure 11:
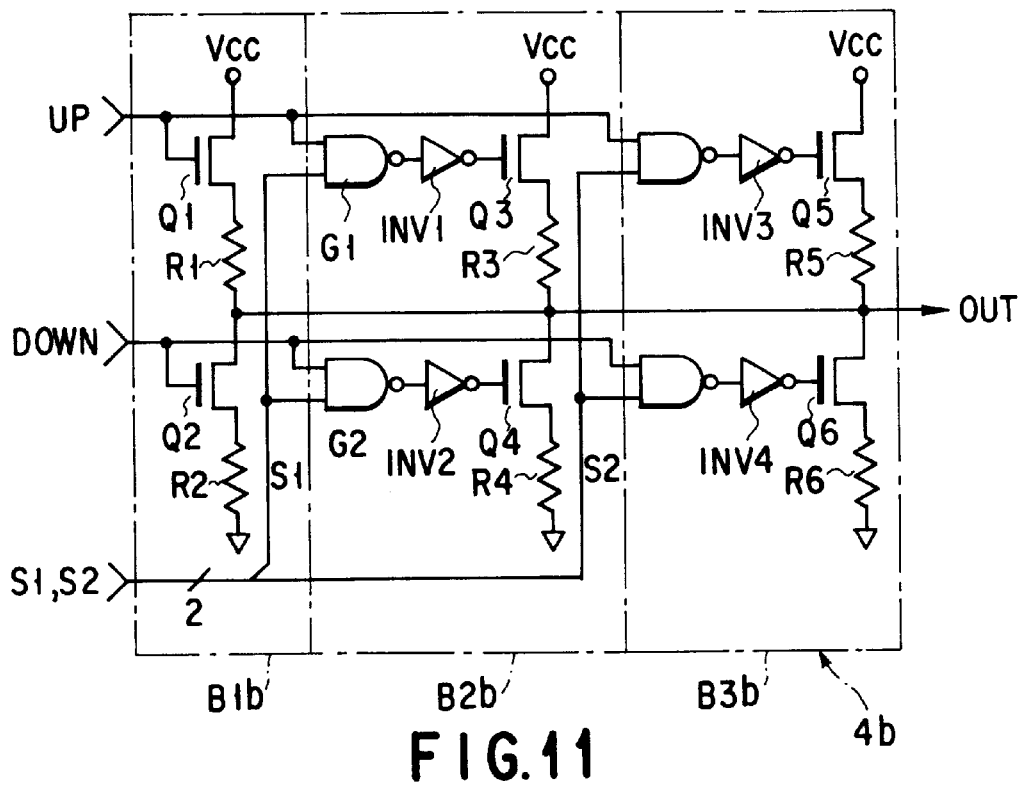
FIG. 11 is a diagram specifically showing a circuit structure of an output buffer of a programmable impedance circuit according to the second embodiment of the present invention.

The buffer portions B1a, B2a and B3a in the output buffer 4 shown in FIG. 8, are provided so as to correspond to the buffer portions DB1, DB2 and DB3 of the dummy buffer 11 shown in FIG. 11. The buffer portion DB2 and the buffer portion B2a, and the buffer portion DB3 and the buffer portion B3a, are selected in pairs in accordance with the logic of the binary section signals S1 and S2.

By contrast, the buffer portion DB1 of the dummy buffer 11, and the buffer portion B1a in the output buffer 4a are selected regardless of the logic of the binary selection signal. The impedance values of the buffer portions DB1, DB2 and DB3 of the dummy buffer 11 are set at multiples by integer (for example, multiplied by 5) of the impedance values of the buffer portions B1a, B2a and B3a in the output buffer 4a.

The ratio between the ON resistances of the MOS transistors Q1, Q3 and Q5 in the buffer portions B1a, B2a and B3a is made substantially the same as the ratio between the values of the resistance elements R1, R3 and R5. Similarly, the ratio between the ON resistances of the MOS transistors Q2, Q4 and Q6 is made substantially the same as the ratio between the values of the resistance elements R2, R4 and R6.

For example, in the case where the current flowing through the dummy resistance element Rd shown in FIG. 7 is substantially equal to the current flowing in the buffer portion DB1 of the dummy buffer 11, the binary selection signals S1 and S2 obtained from the current comparator 9 are (0, 0), and the impedance value of the output buffer 4 is set to be equal to the impedance value of the buffer portion B1a.

Figure 5:
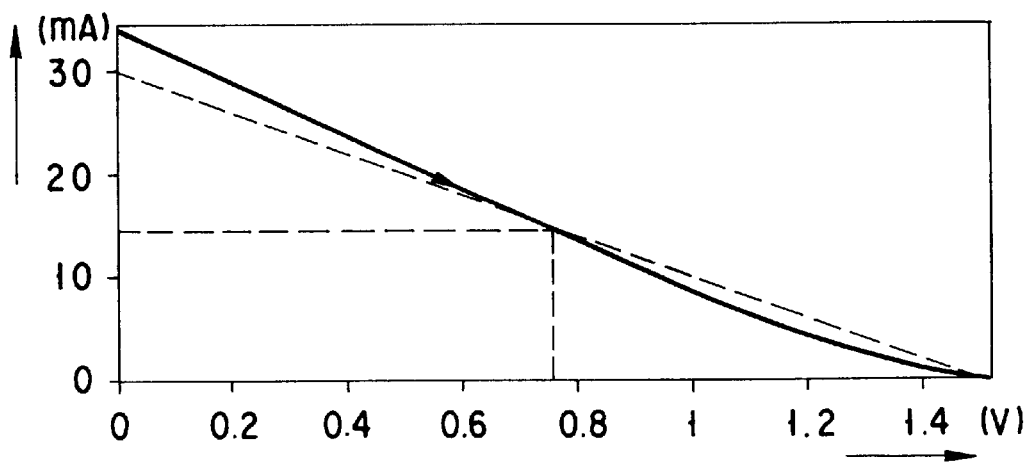
FIG. 5 is a diagram illustrating the characteristics of the output voltage-output current relationship in the case where the output buffer is driven at a high level.

In the case where the binary selection signals S1 and S2 are (0, 0) and the "up" signal output from the sense amplifier 5 shown in FIG. 5 is at high level, the MOS transistor Q1 shown in FIG. 8 is turned on, and the impedance value of the output buffer 4a is set on the basis of the ON resistance of the MOS transistor Q1 and the resistance value of the resistance element R1.

Or in the case where the "down" signal output from the sense amplifier 5 is at high level, the MOS transistor Q2 is turned on, and the impedance value of the output buffer 4a is set on the basis of the ON resistance of the MOS transistor Q2 and the resistance value of the resistance element R2.

Further, in the case where the total of the currents flowing in the buffer portions DB1 and DB2 of the dummy buffer 11, is substantially equal to the current flowing through the dummy resistance element Rd shown in FIG. 7, the binary selection signals S1 and S2 are (1, 0), and the impedance value of the output buffer 4 is set on the basis of the total of the impedance values of the buffer portions B1a and B2a.

In the case where the binary selection signals S1 and S2 are (1, 0) and the "up" signal output from the sense amplifier 5 in this occasion, is at high level, the MOS transistors Q1 and Q3 shown in FIG. 8 are turned on, and the impedance value of the output buffer 4a is set on the basis of the ON resistance of the MOS transistor Q1, the resistance value of the resistance element R1, the ON resistance of the MOS transistor Q3, and the resistance value of the resistance element R3.

Or in the case where the "down" signal output from the sense amplifier 5 is at high level, the MOS transistors Q2 and Q4 are turned on, and the impedance value of the output buffer 4a is set on the basis of the ON resistance of the MOS transistor Q2, the resistance value of the resistance element R2, the ON resistance of the MOS transistor Q4 and the resistance value of the resistance element R4.

Further, in the case where the total of the currents flowing in the buffer portions DB1 and DB3 of the dummy buffer 11, is substantially equal to the current flowing through the dummy resistance element Rd shown in FIG. 7, the binary selection signals S1 and S2 are (0, 1), and the impedance value of the output buffer 4a is set on the basis of the basis of the ON resistance of the MOS transistor Q2, the resistance value of the resistance element R2, the ON resistance of the MOS transistor Q4 and the resistance value of the resistance element R4. The impedance value of the output buffer 4a is set on the basis of the impedance values of the buffer portions B1a and B3a.

In the case where the binary selection signals S1 and S2 are (0, 1) and the "up" signal output from the sense amplifier 5, is at high level, the MOS transistors Q1 and Q5 shown in FIG. 8 are turned on, and the impedance value of the output buffer 4a is set on the basis of the ON resistance of the MOS transistor Q1, the resistance value of the resistance element R1, the ON resistance of the MOS transistor Q5, and the resistance value of the resistance element R5.

Or in the case where the "down" signal output from the sense amplifier 5 is at high level, the MOS transistors Q2 and Q6 shown in FIG. 8 are turned on, and the impedance value of the output buffer 4a is set on the basis of the ON resistance of the MOS transistor Q2, the resistance value of the resistance element R2, the ON resistance of the MOS transistor Q6 and the resistance value of the resistance element R6.

Figure 9:
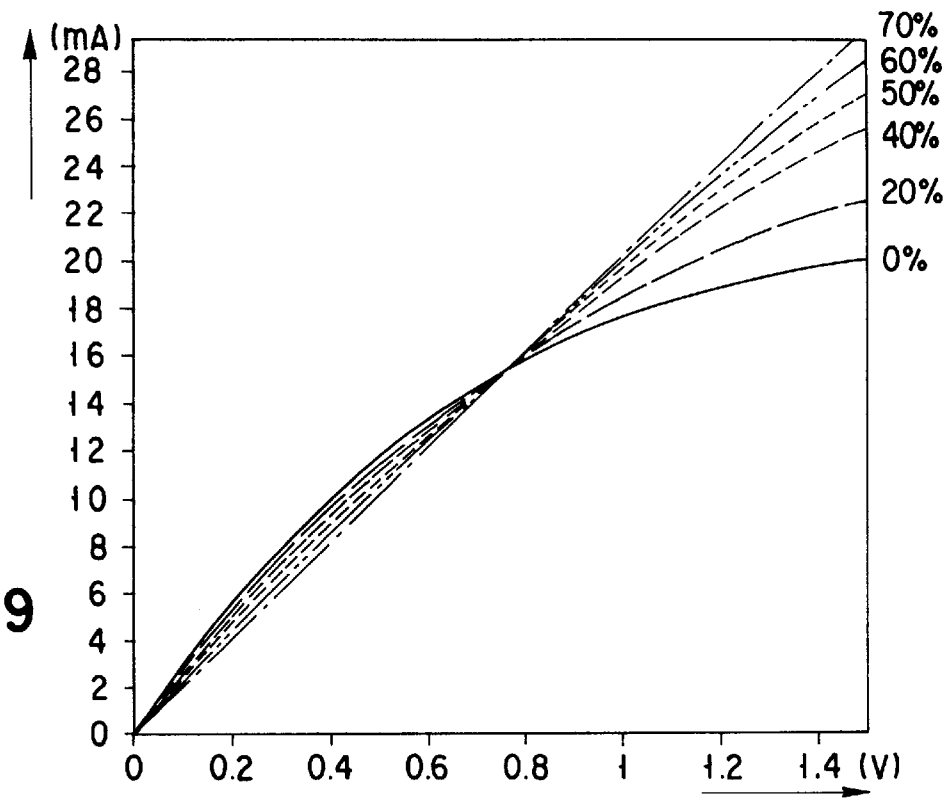
FIG. 9 is a diagram illustrating the characteristics of an output voltage-output current of the output buffer shown in FIG. 8.

FIG. 9 is a graph showing the relationship between output voltage and output current of the output buffer 4a.

More specifically, this figure illustrates the characteristic change in the case where the total of the ON resistances of the MOS transistors Q1 and Q2 in the buffer portion B1a, the resistance values of the resistance elements R1 and R2, the ON resistances of the MOS transistors Q3 and Q4 in the buffer portion B2a, the resistance values of the resistance elements R3 and R4, the ON resistances of the MOS transistors Q5 and Q6 in the buffer portion B3a, and the resistance values of the resistance elements R5 and R6, are set at constant, and the ratio of the resistance of the resistance element R1 and others, to the total is changed.

As can be seen in this figure, as the ratio of the resistance value of the resistance element R1 is increased, the relationship between the output voltage and the output current changes linearly, and the variance of the impedance value in the transient state becomes less. However, in order to increase the ratio of the resistance of the resistance element R1 and the others, it is necessary to increase the gate width of the MOS transistor, thus lowering the ON resistance value.

Figure 10:
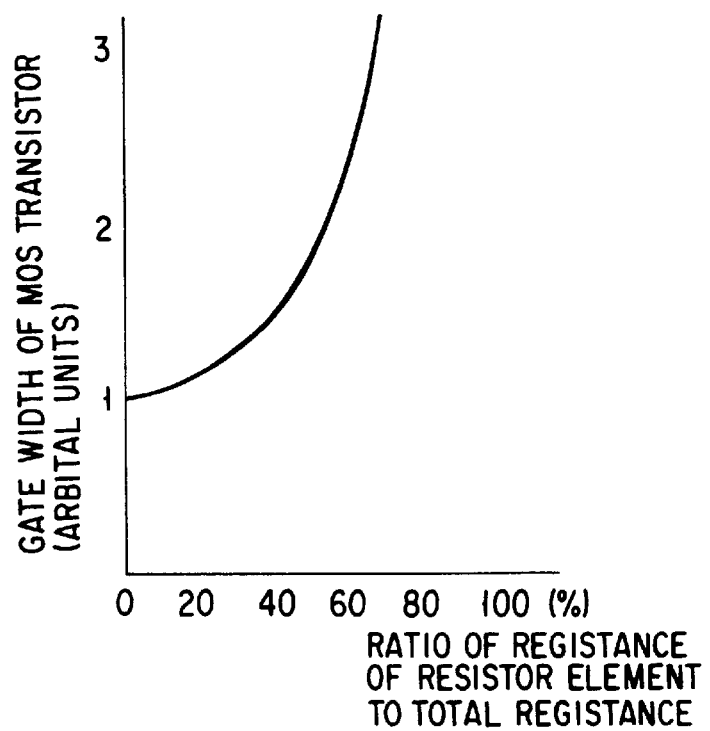
FIG. 10 is a characteristic diagram showing the relationship between the gate width of a MOS transistor and a value of the ratio of the resistance value of each resistance element of each buffer portion of the output buffer shown in FIG. 8 to the total of the ON resistance value of the all the MOS transistors in the buffer portions and the resistance value of all the resistance elements.

FIG. 10 is a graph showing the relationship between the ratio of each of the resistance values of the resistance elements R1 to R6 to the total of the ON resistances of the MOS transistors Q1 to Q6, and the resistance values of the resistance elements R1 to R6, which is set to be constant, taken in the horizontal axis, and the ratio of the gate widths of the MOS transistors Q1 to Q6, taken in the vertical axis.

The ratio of the gate width of the MOS transistors, indicated by the vertical axis, is defined as follows. That is, the gate width of the MOS transistors Q1 to Q4 in the case where the resistance elements R1 to R6 are not connected respectively to the MOS transistors Q1 to Q4 shown in FIG. 8 is set to 1, and the increasing state of the gate widths of the MOS transistors Q1 to Q4 as the ratio of the resistance value of each of the resistance elements R1 to R6 to the above-mentioned total resistance value, increases, is expressed in ratio.

As is clear from FIG. 10, in order to have a ratio of the resistance value of each of the resistance elements R1 to R6 to the above-mentioned total resistance value, to be, for example, 70% or higher, the gate widths of the MOS transistors Q1 to Q6 should be increased by 3 times or more. However, if the gate widths of the MOS transistors Q1 to Q6 is increased, the size of the chip is inevitably increased. Therefore, in practice, the ratio should preferably be set to about 50% to 70%.

As described above, the programmable impedance circuit according to the first embodiment of the present invention, which is shown in FIG. 8 has a particular structure. That is, in the respective one of the buffer portions B1a, B2a and B3a which constitute the output buffer 4a, the MOS transistors Q1 and Q2 and the resistance elements R1 and R2, the MOS transistors Q3 and Q4 and the resistance elements R3 and R4, and the MOS transistors Q5 and Q6 and the resistance elements R5 and R6 are provided. With this structure, the impedance value of each of the buffer portions B1a, B2a and B3a is set on the basis of the ON resistance values of the MOS transistors Q1 to Q6 and the resistance values of the resistance elements R1 to R6. Therefore, even if the output voltage is in a state of transient change, the impedance variance of each of the buffer portions B1a, B2a and B3a becomes less, making it easier to carry out the impedance matching when they are mounted on a printed circuit board or the like.

It should be noted that in the case where resistance elements R1 to R6 such as shown in FIG. 8 are formed on a semiconductor substrate, the amount of impurity ions implanted and the width, length, and the like of each of resistance elements vary during the manufacturing process, and therefore the impedance values of the resistance elements R1 to R6 are dispersed. However, in this embodiment, the impedance value of the output buffer 4a is set in accordance with the impedance value of the dummy resistance element Rd provided outside. With this structure, the impedance value of the output buffer 4a can be set regardless of the dispersion of the resistance value of each resistance element.

It should be also noted that in the output buffer 4a shown in FIG. 8, the resistance elements R1 to R6 are connected to the drain terminals of the MOS transistors Q1 to Q6, respectively; however it is also possible that the elements are connected to the source terminals of the transistors.

FIG. 11 is a diagram showing an example of the output buffer 4b in which resistance elements R1 to R6 are connected to source terminals of MOS transistors Q1 to Q6, respectively. In this case, the impedance values of the buffer portions B1a, B2a and B3a are determined on the basis of the ON resistances of the MOS transistors Q1 and Q2, and the resistance values of the resistance elements R1 and R2, the ON resistances of the MOS transistors Q3 and Q4, and the resistance values of the resistance elements R3 and R4, and the ON resistances of the MOS transistors Q5 and Q6, and the resistance values of the resistance elements R5 and R6. In this manner, the impedance variance can be suppressed as in the case of the output buffer 3 shown in FIG. 8.

Further, in any of the cases shown in FIGS. 8 and 11, the resistance elements R1 to R6 are respectively connected to the MOS transistors Q1 to Q6. With this structure, the voltage VDS between drain and source can be made low, thus making it possible to prevent the generation of hot carriers.

Furthermore, the resistance elements R2, R4 and R6 shown in FIG. 8 and the resistance elements R1, R3 and R5 shown in FIG. 11 serve as protection circuits for the case where a high voltage is applied from outside due to static electricity to the output terminal out of each of the output buffers 4a and 4b. With these resistances provided, the electrostatic breakage does not easily occur.

Next, a programmable impedance circuit according to the second embodiment of the present invention will now be described with reference to FIG. 12.

Figure 12:
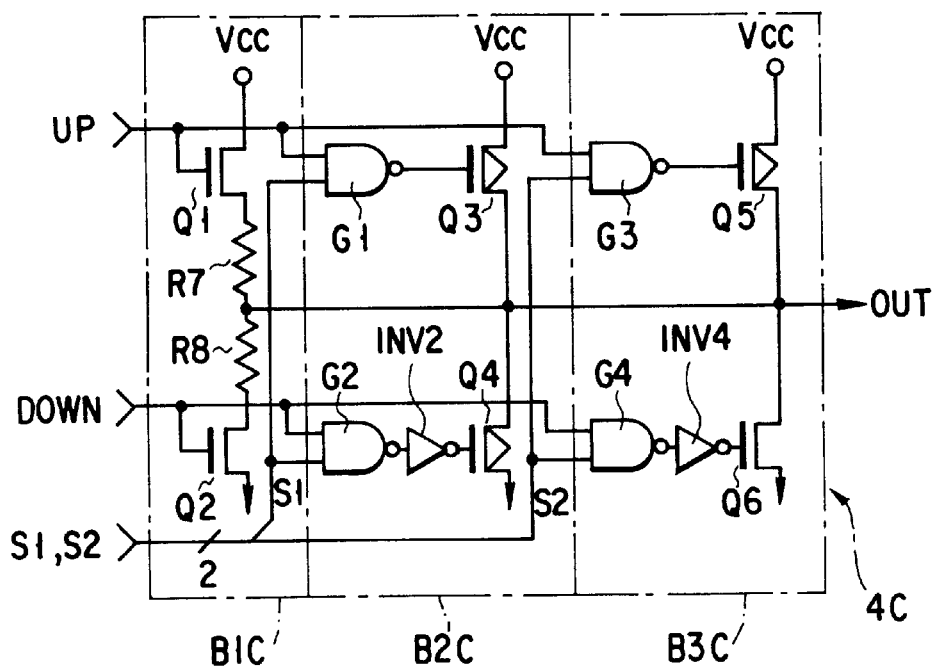
FIG. 12 is a diagram specifically showing a circuit structure of an output buffer of a programmable impedance circuit according to the third embodiment of the present invention.

The first embodiment was described in connection with the case where the resistance elements R1 and R2, R3 and R4, and R5 and R6 are respectively provided within the buffer portions B1a, B2a and B3a which constitute the output buffer 4a; however it is also possible that the resistance elements R7 and R8 are provided only in a part of the output buffer 4c, that is, the buffer portion B1c, as shown in FIG. 12.

The output buffer 4c consists of three buffer portions B1c, B2c and B3c.

The buffer portion B1a includes an NMOS transistor Q1, an NMOS transistor Q2 and resistance elements R7 and R8. A source terminal of the NMOS transistor Q1 is connected to a power terminal Vcc, and a drain terminal thereof is connected to an end of the resistance element R7. Another end of the resistance element R7 is connected to an end of the resistance element R8, and another end of the resistance element R8 is connected to a drain terminal of the transistor Q2. Further, a source terminal of the transistor Q2 is grounded. To a gate terminal of the NMOS transistor Q1, an "up" signal output from the sense amplifier 5 shown in FIG. 6 is input, whereas to a gate terminal of the transistor Q2, a "down" signal output from the sense amplifier 5 is input.

In the meantime, the buffer portion B2c includes a NAND gate G1, a PMOS transistor Q3 whose gate is connected to an output terminal of the NAND gate G1, a NAND gate G2, an inverter INV2 for inverting an output from the NAND gate G2, and a NMOS transistor Q4 whose gate is connected to an output terminal of the inverter INV2.

An "up" signal is input to one of input terminals of the NAND gate G1, whereas a binary selection signal S1 is input to another one of the input terminal.

Further, a "down" signal is input to one of the input terminals of the NAND gate G2, and the binary section signal S1 is input to the other input terminal.

In the meantime, the buffer portion B3c includes a NAND gate G3 and a PMOS transistor Q5 which are connected as in the case of the buffer portion B2c, and further includes a NAND gate G4, an inverter INV4 and an NMOS transistor Q6.

In the case where the binary selection signals S1 and S2 output from the A/D converter shown in FIG. 6 are (0, 0) and the "up" signal output from the sense amplifier 5 is at high level, the MOS transistor Q1 is turned on, and the impedance value of the output buffer 4 is set on the basis of the ON resistance of the MOS transistor Q1 and the resistance value of the resistance element R7.

Or in the case where the "down" signal is at high level, the impedance value of the output buffer 4c is set on the basis of the ON resistance of the MOS transistor Q2 and the resistance value of the resistance element R8.

In the case where the binary selection signals S1 and S2 are (0, 1), and the "up" signal is at high level, the NMOS transistor Q1 and the PMOS transistor Q5 are turned on, and the impedance value of the output buffer 4c is set on the basis of the ON resistance of the transistor Q1 and Q5, and the resistance value of the resistance element R7. Or in the case where the "down" signal is at high level, the NMOS transistors Q2 and Q6 are turned on, and the impedance value of the output buffer 4c is set on the basis of the ON resistance of the NMOS transistors Q2 and Q6, and the resistance value of the resistance element R8.

Figure 13:
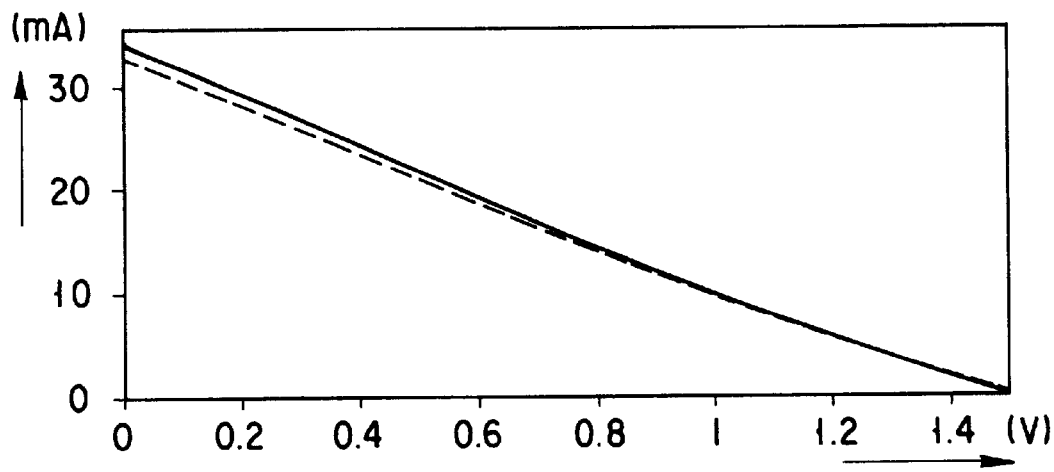
FIG. 13 is a diagram showing the characteristics of output voltage-output current, exhibited along with the variance in the impedance in the case where the output voltage varies from a low level to a high level in the circuit of the output buffer shown in FIG. 12.

FIG. 13 is a diagram showing the relationships between output voltage and output current, the solid curve indicating the actual measurement taken in the case where the output voltage from the output buffer varies from a low level to a high level, and the dotted line indicating the ideal straight line in the case where the impedance value is constant. The output buffer 4c shown in FIG. 12 is capable of controlling the impedance value at substantially constant even in a transient state in which the output voltage varies.

In the above-described second embodiment, of the three buffer portions B1c, B2c and B3c, only the buffer portion B1c includes resistance elements R7 and R8; however even if the binary selection signals S1 and S2 are switched in any way, the impedance value of the output buffer 4c becomes a value which depends upon the resistance values of the resistance elements R7 and R8.

Therefore, when the impedance values of the resistance elements R7 and R8 are set in advance such that the ratio of the resistance value of the resistance elements R7 and R8 with respect to the impedance value of the output buffer 4c, to the total resistance value of the ON resistance of the MOS transistors Q1 to Q6 and the resistance values of the resistance elements R1 to R6 becomes, for example, 50%, the variation of the impedance value in a transient state becomes small.

Furthermore, the resistance elements R7 and R8 shown in FIG. 12 serve as protection circuits for the case where a high voltage is applied from outside due to static electricity to the output terminal (out) of the output buffer 4c. With these resistances provided, the electrostatic breakage does not easily occur.

Next, an output buffer of the programmable impedance circuit according to the third embodiment of the present invention will now be described.

The first and second embodiments were described in connection with the case where complimentary input data "up" signal and "down" signal are input to the output buffer 4; however the present invention is applicable to the output buffer 4 to which one of the complimentary input data (that is, one of the "up" and "down" signals) is input.

Figure 14:
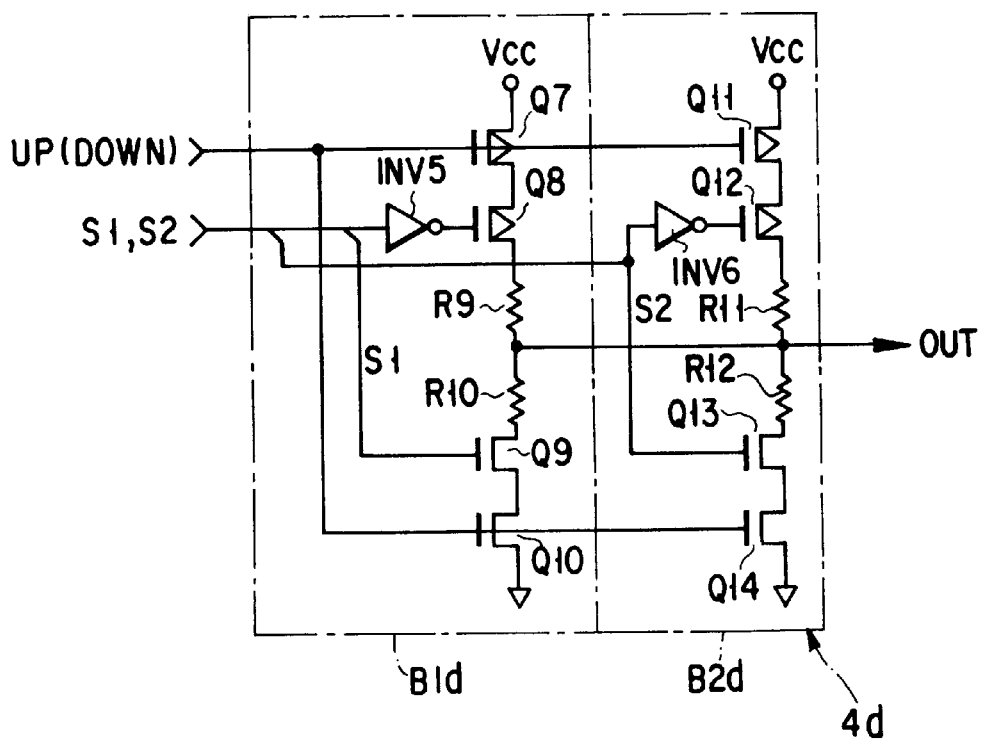
FIG. 14 is a diagram specifically showing a circuit structure of an output buffer of a programmable impedance circuit according to the fourth embodiment of the present invention.

FIG. 14 is a circuit diagram showing an internal structure of the output buffer 4d according to the fourth embodiment of the present invention. The output buffer 4d consists of buffer portions B1d and B2d.

The buffer portion B1d includes PMOS transistors Q7 and Q8, NMOS transistors Q9 and Q10, an inverter INV5 and resistance elements R9 and R10.

A source terminal of the PMOS transistor Q7 is connected to power Vcc, and a drain terminal thereof is connected to a source terminal of the PMOS transistor Q8. The drain terminal of the PMOS transistor Q8 is connected to an end of the resistance element R9. Another end of the resistant element R9 is connected to an end of the resistance element R10, and another end of the resistance element R10 is connected to a drain terminal of the NMOS transistor Q9. A source terminal of the NMOS transistor Q9 is connected to a drain terminal of the NMOS transistor Q10, and a source terminal of the NMOS transistor Q10 is grounded.

To the gate terminals of the PMOS transistor Q7 and the NMOS transistor Q10, one of the complimentary input data ("up" signal or "down" signal) is input, whereas to the gate terminal of the NMOS transistor Q9, the binary selection signal S1 is input. To the gate terminal of the PMOS transistor Q8, an inversion signal of the binary selection signal S1 is input.

The buffer portion B2d includes PMOS transistors Q11 and Q12, NMOS transistors Q13 and Q14, an inverter INV6 and resistance elements R11 and R12. A source terminal of the PMOS transistor Q11 is connected to power Vcc, and a drain terminal thereof is connected to a source terminal of the PMOS transistor Q12. The drain terminal of the PMOS transistor Q12 is connected to an end of the resistance element R11. Another end of the resistant element R11 is connected to an end of the resistance element R12, and another end of the resistance element R12 is connected to a drain terminal of the NMOS transistor Q13. A source terminal of the NMOS transistor Q13 is connected to a drain terminal of the NMOS transistor Q14, and a source terminal of the NMOS transistor Q14 is grounded.

To the gate terminals of the PMOS transistor Q11 and the NMOS transistor Q14, one of the complimentary input data ("up" signal or "down" signal), which is the same as the signal input to the gate terminal of the PMOS transistor Q7, is input.

To the gate terminal of the NMOS transistor Q13, the binary selection signal S2 is input, and to the gate terminal of the PMOS transistor Q12, an inversion signal of the binary selection signal S2 is input via the inverter INV6.

As regards FIG. 14, in the case where the binary selection signals S1 and S2 are, for example, (0, 0), both of the PMOS transistor Q8 and the NMOS transistor Q9 are turned on. In this case, if either one of the complimentary input data is at low level, the PMOS transistor 7 is turned on, and the impedance value of the output buffer 4d is set on the basis of the ON resistances of the PMOS transistors Q7 and Q8 and the resistance value of the resistance element R9.

Or in the case where either one of the complimentary data is at high level, the NMOS transistor Q10 is turned on, and the impedance value of the output buffer 4d is set on the basis of the ON resistances of the NMOS transistors Q9 and Q10 and the resistance value of the resistance element R10.

Meanwhile, in the case where the binary selection signals S1 and S2 are (0, 1), both of the PMOS transistor Q12 and the NMOS transistor Q13 are turned on. In this case, if either one of the complimentary input data is at low level, the PMOS transistor 11 is turned on, and the impedance value of the output buffer 4d is set on the basis of the ON resistances of the PMOS transistors Q11 and Q12 and the resistance value of the resistance element R11.

Or in the case where either one of the complimentary data is at high level, the NMOS transistor Q14 is turned on, and the impedance value of the output buffer 4a is set on the basis of the ON resistances of the NMOS transistors Q13 and Q14 and the resistance value of the resistance element R12.

As described above, even in the case of an output buffer to which either one of complimentary input data (that is, "up" signal or "down" signal) is input, the impedance value can be set in accordance with the logic level of the selection signals S1 and S2.

In the first and second embodiments, an example where the output buffer 4 is made of three buffer portions B1a, B2a and B3a; however the number of buffer portions or dummy buffer portions is not limited to 3. Similarly, in the third embodiment, the number of buffer portions is not limited to 2, that is, B1d and B2d; but three or more buffer portions may be provided.

Further, in the first to third embodiments, the circuit elements which constitute the buffer portions B1a, B2a and B3a are not limited to those shown in the figures. It is possible for example that an AND gate is provided in place of the NAND gate, or a PMOS transistor is connected in place of an NMOS transistor with the removal of the inverter.

Further, in the embodiment shown in FIG. 12, the resistance elements R7 and R8 are provided only in the buffer portion B1c; however it is also possible that they are provided only in the buffer portions B2c and B3c.

For example, FIG. 15 is a circuit diagram specifically showing an example of the output buffer 4e, where a resistance element is not provided in the buffer portion B1e, but provided in other ones, buffer portions B2e and B3e.

As regards the above-described example, in the case where the binary selection signals S1 and S2 are (0, 0), the impedance value cannot be set by the resistance element. However, in the case where the binary selection signals S1 and S2 are (1, 0) or (0, 1), the same effect as that obtained with the output buffer shown in FIG. 12 can be obtained.

In the case where resistance elements are provided only in some of the MOS transistors Q1 to Q6 as shown in FIGS. 12 and 15, it is preferable that the elements should be connected to MOS transistors having a higher conductance. This is because the impedance of the circuit as a whole is greatly influenced by the ON resistance of a MOS transistor having a high conductance.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A programmable impedance circuit comprising:
   a dummy resistance element;
   dummy buffer element including a plurality of buffer portions, each buffer portion having a serial circuit made of a transistor and a resistance element;
   a binary selection signal generating circuit, connected to said dummy resistance element and said dummy buffer element, for controlling a current flowing in a predetermined buffer portion of said dummy buffer element to be equalized to a current flowing in said dummy resistance element, and outputting binary selection signals of a logic level indicating matching impedances of said dummy resistance element and said dummy buffet element is achieved when both the current flowing in the predetermined buffer portion of said dummy buffer and the current flowing in said dummy resistance element are equal to each other; and an output buffer for suppressing a variance of an impedance value of said output buffer even when an output voltage is in a transiently changing state, in accordance with the binary selection signals from said binary selection signal generating circuit, and with complimentary logic levels of complimentary input data.

2. A programmable impedance circuit according to claim 1, wherein said output buffer includes a plurality of output buffer portions having different impedances, at least one of said plurality of output buffer portions having a serial circuit of a switching element and a resistance element, and impedance values of said output buffer portions being set in accordance with an ON resistance value of said switching element and a resistance value of said resistance element, wherein some of said plurality of output buffer portions are selected in accordance with the logic level of said binary selection signals and the complimentary input data, and wherein the impedance value of said output buffer is set on the basis of impedance values of said selected output buffer portions.

3. A programmable impedance circuit according to claim 2, wherein said switching element is made of a MOS transistor, and said resistance element is either one of a diffusion resistance formed by diffusing an impurity ion into a semiconductor substrate and a resistance made of polycrystalline silicon.

4. A programmable impedance circuit according to claim 2, wherein said at least one of said plurality of output buffer portions includes a MOS transistor as the switching element and said resistance element connected to either one of a drain terminal and a source terminal of the MOS transistor, and an impedance value of a respective one of said plurality of buffer portions is determined on the basis of a total of an ON resistance of said MOS transistor and a resistance value of said resistance element.

5. A programmable impedance circuit according to claim 2, wherein each of said plurality of output buffer portions includes a MOS transistor, and a resistance element connected to either one of a drain terminal and a source terminal of the MOS transistor, an ON resistance of said MOS transistor and a resistance value of said resistance element differ from one output buffer portion to another, and a ratio of ON resistances of said MOS transistors is substantially proportional to a ratio of resistance values of said resistance elements among said output buffer portions.

6. A programmable impedance circuit according to claim 2, wherein at least another one of said plurality of output buffer portions other than said at least one output buffer portion includes a MOS transistor, and an impedance value of this output buffer portion is determined only by an ON resistance of said MOS transistor.

7. A programmable impedance circuit according to claim 1, wherein said output buffer includes a plurality of output buffer portions having different impedances, and wherein the complimentary input data whose logic levels are complimentary to each other, are input to each of said plurality of output buffer portions, and outputs of said plurality of buffer portions are commonly connected, at least one of said plurality of output buffer portions includes a first NMOS transistor and a first resistance element connected to either one of a drain terminal and a source terminal of the first NMOS transistor, for one of said complimentary input data, and a second NMOS transistor and a second resistance element connected to either one of a drain terminal and a source terminal of the second NMOS transistor, for an other of said complimentary input data, wherein one of the NMOS transistors is turned on in accordance with said complimentary input data and at least one of the binary selection signals, an impedance value of corresponding one of said plurality of buffer portions is set on the basis of an ON resistance of the turned on NMOS transistor and a resistance value of said resistance element connected to the turned on NMOS transistor.

8. A programmable impedance circuit according to claim 7, wherein said complimentary input data are output from a sense amplifier for amplifying cell data read from a memory cell.

9. A programmable impedance circuit according to claim 1, wherein said output buffer includes a plurality of output buffer portions having different impedances, and outputs of said plurality of output buffer portions are commonly connected, and at least one of said plurality of output buffer portions includes a PMOS transistor and a resistance element connected to either one of a drain terminal and a source terminal of the PMOS transistor, said PMOS transistor and the resistance element forming a first serial circuit, and an NMOS transistor and a resistance element connected to either one of a drain terminal and a source terminal of the NMOS transistor, said NMOS transistor and the resistance element forming a second serial circuit connected to said first serial circuit, wherein one of the PMOS transistor and the NMOS transistor is turned on in accordance with said complimentary input data, and said binary selection signals, and an impedance value of corresponding one of said plurality of output buffer portions is set on the basis of an ON resistance of the turned on one of said PMOS transistor and said NMOS transistor and a resistance value of said resistance element connected to the turned on one of said PMOS transistor and said NMOS transistor.

* * * * *

UNITED STATES PATENT AND TRADEMARK OFFICE
CERTIFICATE OF CORRECTION

PATENT NO.: 6,127,862

DATED: October 3, 2000

INVENTOR: Atsushi KAWASUMI

It is certified that an error appears in the above-identified patent and that said Letters Patent is hereby corrected as shown below:

In Claim 7, column 16, line 19:

"an other" has been replaced with --another--.

Signed and Sealed this

Fifteenth Day of May, 2001

*Attest:*

NICHOLAS P. GODICI

*Attesting Officer*     *Acting Director of the United States Patent and Trademark Office*